(12) United States Patent
Chi et al.

(10) Patent No.: US 11,107,842 B2
(45) Date of Patent: Aug. 31, 2021

(54) PIXEL ARRAY SUBSTRATE

(71) Applicant: Au Optronics Corporation, Hsinchu (TW)

(72) Inventors: Yu-Min Chi, Hsinchu (TW); Sung-Yu Su, Tainan (TW); Chen-Feng Fan, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 115 days.

(21) Appl. No.: 16/589,163

(22) Filed: Oct. 1, 2019

(65) Prior Publication Data

US 2020/0350337 A1  Nov. 5, 2020

(30) Foreign Application Priority Data

May 3, 2019 (TW) ................................. 108115461

(51) Int. Cl.
*H01L 27/12* (2006.01)
*G06F 3/044* (2006.01)

(52) U.S. Cl.
CPC .......... *H01L 27/124* (2013.01); *G06F 3/0448* (2019.05)

(58) Field of Classification Search
CPC ... H01L 27/124; G06F 3/0448; G06F 3/0412; G02F 1/134309; G02F 1/1362; G02F 1/136286
See application file for complete search history.

(56) References Cited

U.S. PATENT DOCUMENTS

| 8,772,780 B2 * | 7/2014 | Huang | ............... H01L 27/1244 257/59 |
| 10,042,490 B2 | 8/2018 | Li et al. | |
| 10,088,715 B2 | 10/2018 | Yeh | |
| 10,847,500 B2 * | 11/2020 | Tseng | .................. H04M 1/0266 |
| 2009/0251628 A1 * | 10/2009 | Lin | ..................... G02F 1/13439 349/39 |

(Continued)

FOREIGN PATENT DOCUMENTS

| CN | 106200077 | 12/2016 |
| CN | 104698702 | 9/2017 |
| CN | 108255355 | 7/2018 |

*Primary Examiner* — Karen Kusumakar
*Assistant Examiner* — Adam S Bowen
(74) *Attorney, Agent, or Firm* — JCIPRNET

(57) ABSTRACT

A pixel array substrate includes a substrate, a first patterned conductive layer, a pixel electrode layer, a semiconductor pattern layer, a first dielectric layer, a second patterned conductive layer, a second dielectric layer, and a common electrode layer. The first patterned conductive layer includes first and second scan lines, first and second gates, and first and second connection electrodes. The pixel electrode layer includes first and second pixel electrodes. The semiconductor pattern layer includes first and second patterns. The second patterned conductive layer includes first and second data lines, first and second sources, first and second drains, and a touch wire. The common electrode layer includes a common electrode and first and second transferring electrodes. The first transferring electrode is electrically connected to the first connection electrode and the first drain. The second transferring electrode is electrically connected to the second connection electrode and the second drain.

18 Claims, 6 Drawing Sheets

(56) References Cited

U.S. PATENT DOCUMENTS

| | | | |
|---|---|---|---|
| 2013/0300952 A1* | 11/2013 | Yeh | G06F 3/0446 |
| | | | 349/12 |
| 2016/0291775 A1 | 10/2016 | Li et al. | |
| 2017/0131585 A1* | 5/2017 | Cho | H01L 27/124 |
| 2018/0081472 A1* | 3/2018 | Xi | G06F 3/0443 |
| 2018/0113340 A1* | 4/2018 | Chi | G02F 1/133707 |
| 2018/0188581 A1* | 7/2018 | Peng | G02F 1/13338 |
| 2018/0188614 A1* | 7/2018 | Yeh | G02F 1/134309 |
| 2018/0335916 A1* | 11/2018 | Hao | G06F 3/0416 |
| 2019/0129549 A1* | 5/2019 | Yeh | G02F 1/13338 |
| 2020/0343315 A1* | 10/2020 | Lin | H01L 51/5228 |

* cited by examiner

PIXEL ARRAY SUBSTRATE

CROSS-REFERENCE TO RELATED APPLICATION

This application claims the priority benefit of Taiwan application serial no. 108115461, filed on May 3, 2019. The entirety of the above-mentioned patent application is hereby incorporated by reference herein and made a part of this specification.

BACKGROUND OF THE INVENTION

1. Field of the Invention

The present invention relates to a pixel array substrate, and in particular, to a pixel array substrate including a touch electrode.

2. Description of Related Art

With the development of science and technology, the appearance rate of touch devices in the market has gradually increased, and various related technologies have emerged in an endless stream. In some electronic devices, such as mobile phones, tablet computers, or smart watches, touch devices and display panels are often combined to obtain an easy-to-use touch display device.

In general, a touch substrate with a touch function is additionally attached to the surface of a display panel, so that a touch display device has both touch and display functions. However, the touch display device manufactured in this manner has a thicker appearance and a larger weight. In addition, the touch display device manufactured in this manner is complicated in manufacturing process and high in manufacturing cost.

SUMMARY OF THE INVENTION

The present invention provides a pixel array substrate, which has the advantage of low manufacturing cost.

An embodiment of the present invention provides a pixel array substrate, which includes a substrate, a first patterned conductive layer, a pixel electrode layer, a semiconductor pattern layer, a first dielectric layer, a second patterned conductive layer, a second dielectric layer, and a common electrode layer. The first patterned conductive layer is disposed on the substrate, and includes a first scan line, a second scan line, a first gate connected to the first scan line, a second gate connected to the second scan line, a first connection electrode, and a second connection electrode. Both the first connection electrode and the second connection electrode are structurally separated from the first gate, the second gate, the first scan line, and the second scan line. The pixel electrode layer is disposed on the substrate, and includes a second pixel electrode and a second pixel electrode. The first pixel electrode partially overlaps the first connection electrode. The second pixel electrode partially overlaps the second connection electrode. A first gap is provided between the first pixel electrode and the second pixel electrode. The semiconductor pattern layer is disposed on the substrate, and includes a first pattern and a second pattern. The first pattern partially overlaps the first gate. The second pattern partially overlaps the second gate. The first dielectric layer is disposed on the substrate, and provided between the first pattern and the first gate and between the second pattern and the second gate. The second patterned conductive layer is disposed on the substrate. The second patterned conductive layer includes a first data line, a second data line, a first source, a first drain, a second source, a second drain, and a touch wire. The first source and the first drain are electrically connected to the first pattern. The first source is electrically connected to the first data line. The first gate, the first pattern, the first source, and the first drain form a first switch component. The second source and the second drain are electrically connected to the second pattern. The second source is electrically connected to the first data line. The second gate, the second pattern, the second source, and the second drain form a second switch component. The touch wire is structurally separated from the first data line, the first source, the first drain, the second data line, the second source, and the second drain. The second dielectric layer is disposed on the substrate, and covers a part of the first dielectric layer, the first switch component, the second switch component, the first pixel electrode, and the second pixel electrode. A first opening is located in the second dielectric layer. A first through hole and a second through hole are located in the first dielectric layer and the second dielectric layer. The common electrode layer is disposed on the substrate, and includes a common electrode, a first transferring electrode, and a second transferring electrode. The common electrode has a plurality of slits. The common electrode is electrically connected to the touch wire via the first opening to serve as a touch electrode. Both the first transferring electrode and the second transferring electrode are structurally separated from the common electrode. The first transferring electrode is electrically connected to the first connection electrode and the first drain via the first through hole. The second transferring electrode is electrically connected to the second connection electrode and the second drain via the second through hole.

An embodiment of the present invention provides a pixel array substrate, which includes a substrate, a first patterned conductive layer, a pixel electrode layer, a semiconductor pattern layer, a first dielectric layer, a second patterned conductive layer, a second dielectric layer, and a common electrode layer. The first patterned conductive layer is disposed on the substrate, and includes a first scan line, a second scan line, a first gate connected to the first scan line, a second gate connected to the second scan line, a first connection electrode, and a second connection electrode. Both the first connection electrode and the second connection electrode are structurally separated from the first gate, the second gate, the first scan line, and the second scan line. The pixel electrode layer is disposed on the substrate, and includes a second pixel electrode and a second pixel electrode. The first pixel electrode partially overlaps the first connection electrode. The second pixel electrode partially overlaps the second connection electrode. A first gap is provided between the first pixel electrode and the second pixel electrode. The semiconductor pattern layer is disposed on the substrate, and includes a first pattern and a second pattern. The first pattern partially overlaps the first gate. The second pattern partially overlaps the second gate. The first dielectric layer is disposed on the substrate, and provided between the first pattern and the first gate and between the second pattern and the second gate. The second patterned conductive layer is disposed on the substrate, and includes a first data line, a first source, a first drain, a second data line, a second source, a second drain, and a touch wire. The first source and the first drain are electrically connected to the first pattern. The first source is electrically connected to the first data line. The first gate, the first pattern, the first source, and the first drain form a first switch component. The second source and the second drain are electrically connected to the second pattern. The second source is electrically connected to the second data line. The second gate, the second pattern, the second source, and the second drain form a second switch component. The touch wire is structurally separated from the first data line, the first source, the first drain, the second data line, the second source, and the second drain. The second dielectric layer is disposed on the substrate, and covers a part of the first dielectric layer, the first switch component, the second switch component, the first pixel electrode, and the second pixel electrode. A first opening is located in the second dielectric layer. A first through hole and a second through hole are located in the first dielectric layer and the second dielectric layer. The common electrode layer is disposed on the substrate, and includes a common electrode, a first transferring electrode, and a second transferring electrode. The common electrode has a plurality of slits. The common electrode is electrically connected to the touch wire via the first opening to serve as a touch electrode. Both the first transferring electrode and the second transferring electrode are structurally separated from the common electrode. The first transferring electrode is electrically connected to the first connection electrode and the first drain via the first through hole. The second transferring electrode is electrically connected to the second connection electrode and the second drain via the second through hole.

In order to make the aforementioned and other objectives and advantages of the present invention comprehensible, embodiments accompanied with figures are described in detail below.

DESCRIPTION OF THE EMBODIMENTS

Figure 1:
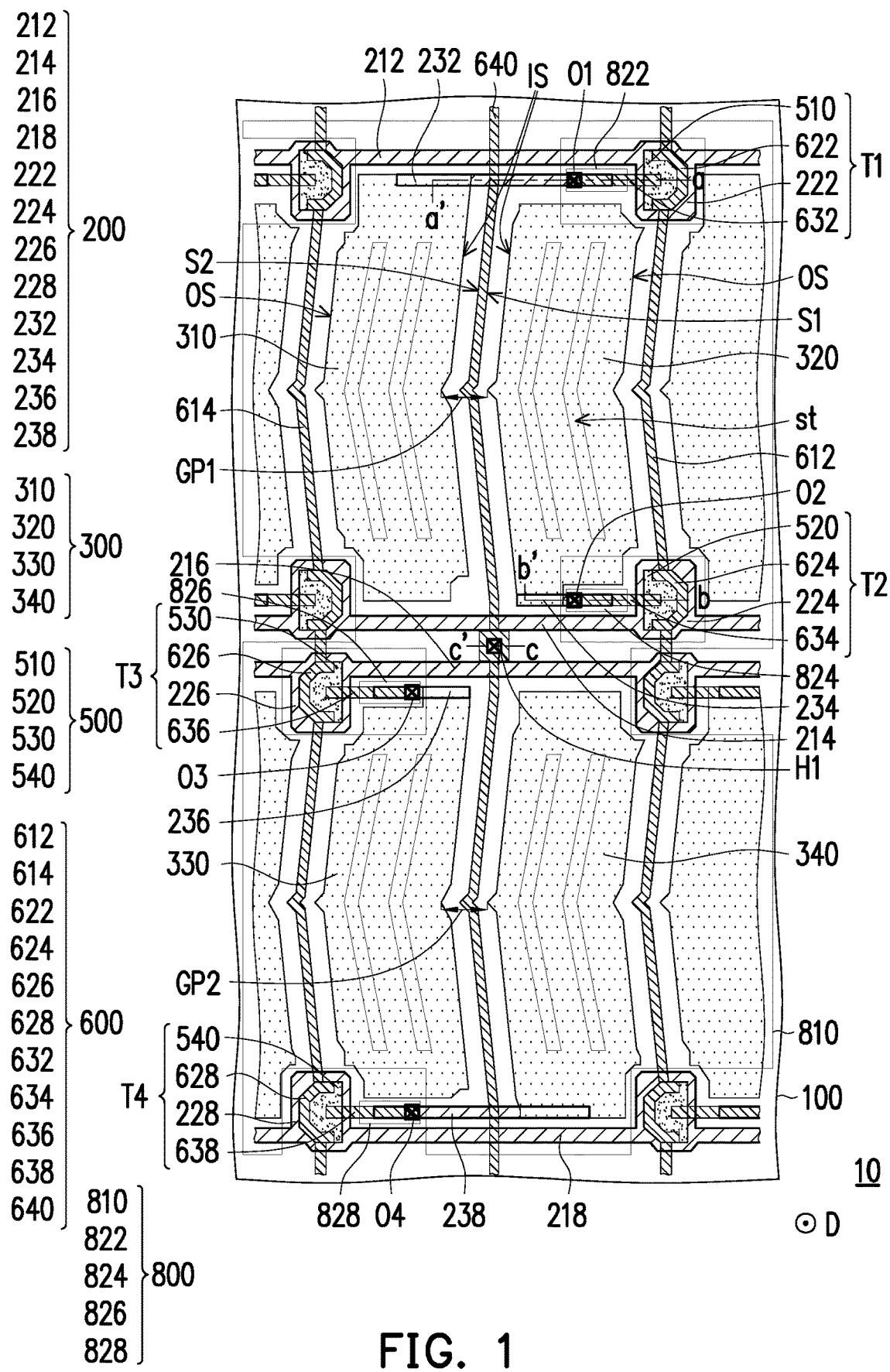
FIG. 1 is a schematic top view of a pixel array substrate in accordance with an embodiment of the present invention.

In the accompanying drawings, the thicknesses of layers, films, panels, regions, and the like are enlarged for clarity. Throughout the specification, same reference numerals indicate same components. It should be understood that when a component such as a layer, film, region or substrate is referred to as being "on" or "connected" to another component, it may be directly on or connected to the another component, or intervening components may also be present. In contrast, when a component is referred to as being "directly on" or "directly connected to" another component, there are no intervening assemblies present. As used herein, "connection" may refer to a physical and/or electrical connection.

As used herein, "about", "approximately", or "substantially" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Further, as used herein, "about", "approximately", or "substantially" may depend on optical properties, etch properties, or other properties to select a more acceptable range of deviations or standard deviations without one standard deviation for all properties.

Unless otherwise defined, all terms (including technical and scientific terms) used herein have the same meaning as commonly understood by one of ordinary skill in the art to which the present invention belongs. It will be further understood that terms such as those defined in commonly used dictionaries should be interpreted as having a meaning that is consistent with their meaning in the context of the relevant art and the present invention and will not be interpreted in an idealized or overly formal sense unless expressly so defined herein.

Figure 2A:
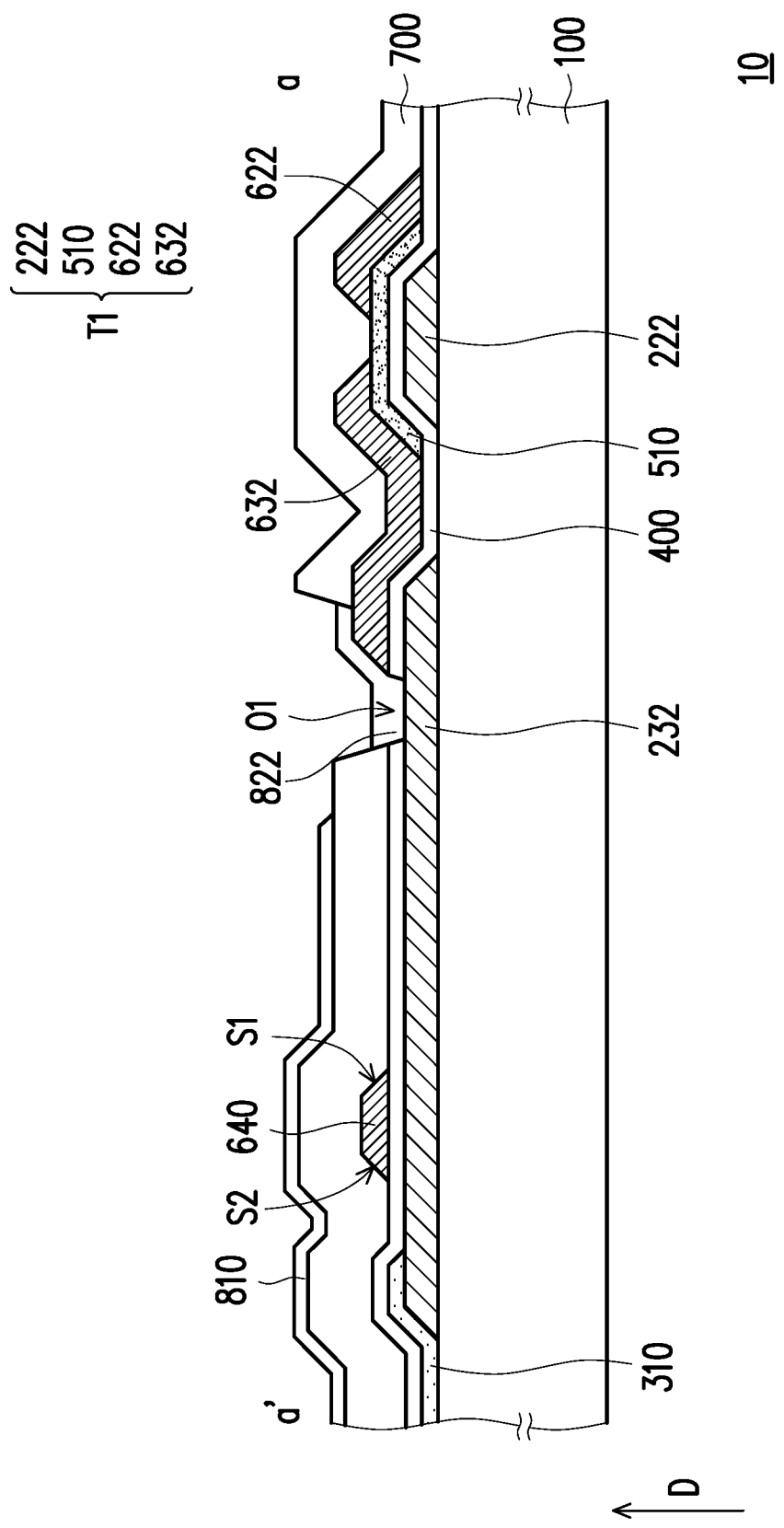
FIG. 2A is a schematic cross-sectional view taken along a line aa' of FIG. 1.
Figure 2B:
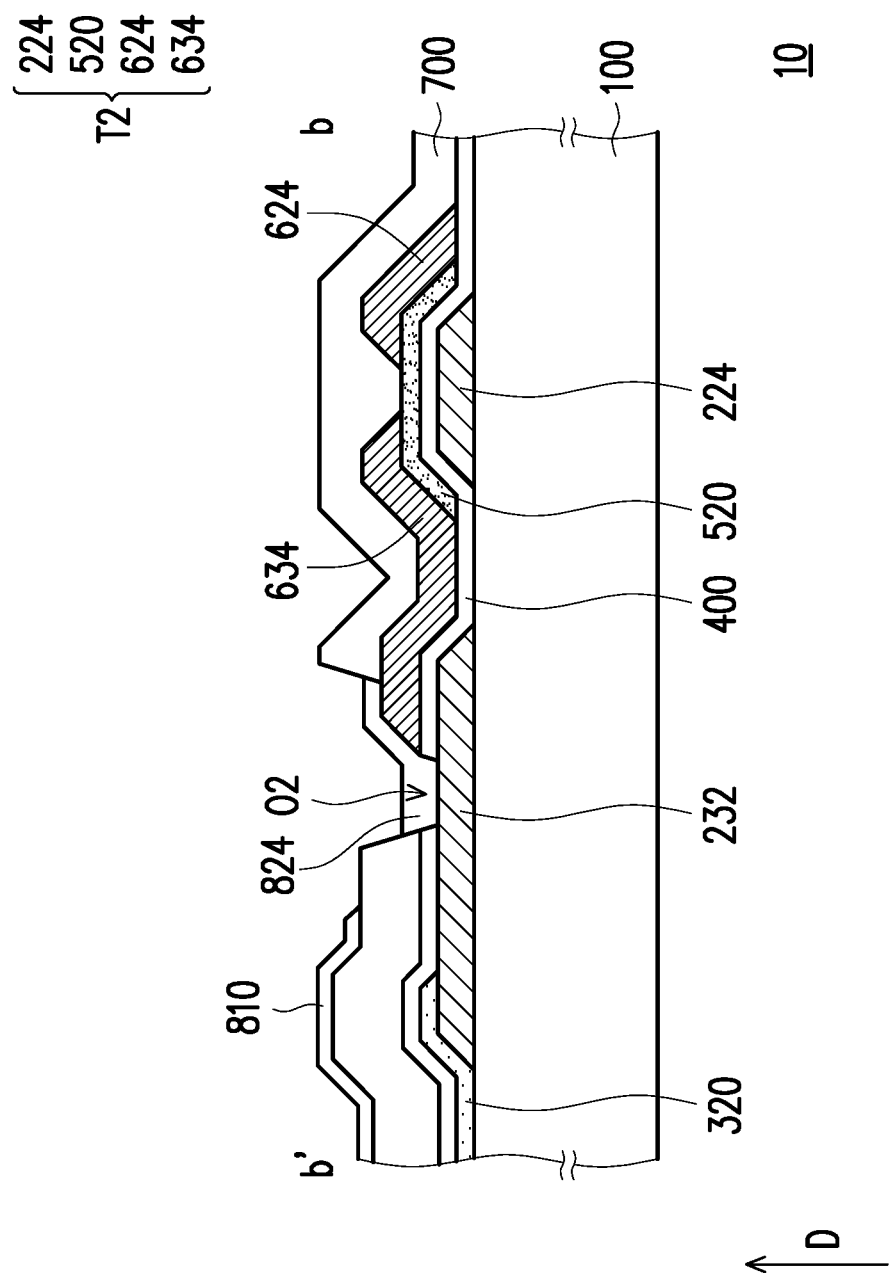
FIG. 2B is a schematic cross-sectional view taken along a line bb' of FIG. 1.
Figure 2C:
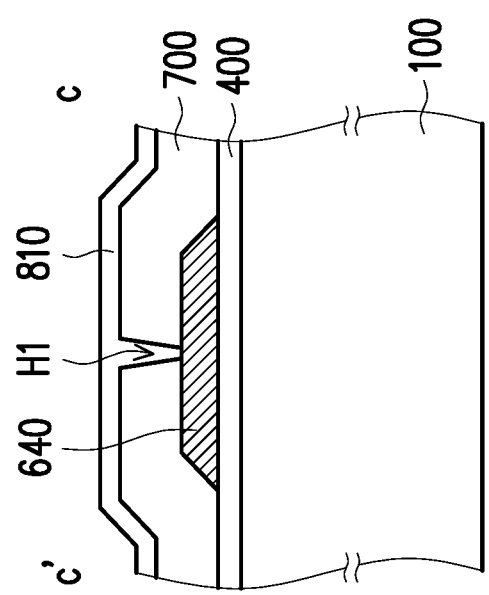
FIG. 2C is a schematic cross-sectional view taken along a line cc' of FIG. 1.

FIG. 1 is a schematic top view of a pixel array substrate in accordance with an embodiment of the present invention. FIG. 2A is a schematic cross-sectional view taken along a line aa' of FIG. 1. FIG. 2B is a schematic cross-sectional view taken along a line bb' of FIG. 1. FIG. 2C is a schematic cross-sectional view taken along a line cc' of FIG. 1. For convenience of explanation, FIG. 1 omits some of the components in FIG. 2A to FIG. 2C.

Referring to FIG. 1, FIG. 2A, and FIG. 2B, a pixel array substrate 10 includes a substrate 100, a first patterned conductive layer 200, a pixel electrode layer 300, a first dielectric layer 400, a semiconductor pattern layer 500, a second patterned conductive layer 600, a second dielectric layer 700, and a common electrode layer 800. In the present embodiment, the pixel array substrate 10 is applied to a half source driving (HSD) technology.

The material of the substrate 100 may be glass, quartz, organic polymer or a lightproof/reflective material (for example, a conductive material, metal, a wafer, ceramics or other applicable materials) or other applicable materials. If the conductive material or metal is used, the substrate 100 is covered with an insulating layer (not shown) to avoid short circuit problems.

The first patterned conductive layer 200 is disposed on the substrate 100, and includes a first scan line 212, a second scan line 214, a first gate 222 connected to the first scan line 212, a second gate 224 connected to the second scan line 214, a first connection electrode 232, and a second connection electrode 234. In the present embodiment, the first patterned conductive layer 200 further includes a third scan line 216, a fourth scan line 218, a third gate 226 connected to the third scan line 216, a fourth gate 228 connected to the fourth scan line 218, a third connection electrode 236, and a fourth connection electrode 238. The first patterned conductive layer 200 is generally made of a metal material (pure metal or alloy), but the present invention is not limited thereto. In other embodiments, the first patterned conductive layer 200 may also be made of other conductive materials, such as a nitride of a metal material, an oxide of a metal material, an oxynitride of a metal material or other suitable materials or a stacked layer of the foregoing materials.

The first connection electrode 232, the second connection electrode 234, the third connection electrode 236, and the fourth connection electrode 238 are all structurally separated from the first gate 222, the second gate 224, the third gate 226, the fourth gate 228, the first scan line 212, the second scan line 214, the third scan line 216, and the fourth scan line 218.

The pixel electrode layer 300 is disposed on the substrate 100, and includes a second pixel electrode 310 and a second pixel electrode 320. In the present embodiment, the pixel electrode layer 300 further includes a third pixel electrode 330 and a fourth pixel electrode 340. In the present embodiment, the material of the pixel electrode layer 300 includes a transparent metal oxide conductive material or other suitable materials, such as, but not limited to, an indium tin oxide, an indium zinc oxide, an aluminum tin oxide, an aluminum zinc oxide, an indium gallium zinc oxide or other suitable materials or a stacked layer of the foregoing materials.

The first pixel electrode 310 partially overlaps the first connection electrode 232. The second pixel electrode 320 partially overlaps the second connection electrode 234. In the present embodiment, the first pixel electrode 310 is in direct contact with the first connection electrode 232, and the second pixel electrode 320 is in direct contact with the second connection electrode 234. In the present embodiment, other insulating layers are not formed between the first pixel electrode 310 and the first connection electrode 232 and between the second pixel electrode 320 and the second connection electrode 234, but the present invention is not limited thereto.

The first transferring electrode 232 does not overlap the second pixel electrode 320 in a direction D perpendicular to the substrate 100. The second transferring electrode 234 does not overlap the first pixel electrode 310 in the direction D perpendicular to the substrate 100. In the present embodiment, the second pixel electrode 320 is located between the first transferring electrode 232 and the second transferring electrode 234. The area of the second pixel electrode 320 is smaller than the area of the first pixel electrode 310. Therefore, contact between the first transferring electrode 232 and the second pixel electrode 320 can be avoided.

The third pixel electrode 330 partially overlaps the third connection electrode 236. The fourth pixel electrode 340 partially overlaps the fourth connection electrode 238. In the present embodiment, the third pixel electrode 330 is in direct contact with the third connection electrode 236, and the fourth pixel electrode 340 is in direct contact with the fourth connection electrode 238. In the present embodiment, other insulating layers are not formed between the third pixel electrode 330 and the third connection electrode 236 and between the fourth pixel electrode 340 and the fourth connection electrode 238, but the present invention is not limited thereto.

The third transferring electrode 236 does not overlap the fourth pixel electrode 340 in the direction D perpendicular to the substrate 100. The fourth transferring electrode 238 does not overlap the third pixel electrode 330 in the direction D perpendicular to the substrate 100. In the present embodiment, the third pixel electrode 330 is located between the third transferring electrode 236 and the fourth transferring electrode 238. The area of the third pixel electrode 330 is smaller than the area of the fourth pixel electrode 340. Therefore, contact between the fourth transferring electrode 238 and the third pixel electrode 330 can be avoided.

A first gap GP1 is provided between the first pixel electrode 310 and the second pixel electrode 320. A second gap GP2 is provided between the third pixel electrode 330 and the fourth pixel electrode 340.

In some embodiments, the first pixel electrode 310 and the third pixel electrode 330 correspond to sub-pixels of the same color (e.g., red, green, or blue), the second pixel electrode 320 and the fourth pixel electrode 340 correspond to sub-pixels of another same color, but the present invention is not limited thereto. The color of the sub-pixels corresponding to the first pixel electrode 310, the third pixel electrode 330, the second pixel electrode 320, and the fourth pixel electrode 340 may be adjusted according to actual needs.

The first dielectric layer 400 is disposed on the substrate 100. In the present embodiment, the first dielectric layer 400 covers a part of the substrate 100, the first patterned conductive layer 200, and the pixel electrode layer 300, but the present invention is not limited thereto.

The semiconductor pattern layer 500 is disposed on the substrate 100. In the present embodiment, the semiconductor pattern layer 500 is formed on the first dielectric layer 400, but the present invention is not limited thereto.

The semiconductor pattern layer 500 includes a first pattern 510 and a second pattern 520. In the present embodiment, the semiconductor pattern layer 500 further includes a third pattern 530 and a fourth pattern 540. In the present embodiment, the semiconductor pattern layer 500 is a single-layer or multi-layer structure, including amorphous silicon, polycrystalline silicon, microcrystalline silicon, monocrystalline silicon, an organic semiconductor material, an oxide semiconductor material (e.g., an indium zinc oxide, an indium gallium zinc oxide or other suitable materials or a combination of the above materials) or other suitable materials or dopants in the above materials or a combination of the above materials.

The first pattern 510 partially overlaps the first gate 222. The second pattern 520 partially overlaps the second gate 224. The third pattern 530 partially overlaps the third gate 226. The fourth pattern 540 partially overlaps the fourth gate 228.

The first dielectric layer 400 is provided between the first pattern 510 and the first gate 222, between the second pattern 520 and the second gate 224, between the third pattern 530 and the third gate 226, and between the fourth pattern 540 and the fourth gate 228.

The second patterned conductive layer 600 is disposed on the substrate 100. In the present embodiment, the second patterned conductive layer 600 is formed on the first dielectric layer 400 and the semiconductor pattern layer 500, but the present invention is not limited thereto. The second patterned conductive layer 600 is generally made of a metal material, but the present invention is not limited thereto. In other embodiments, the second patterned conductive layer 600 may also be made of other conductive materials, such as alloy, a nitride of a metal material, an oxide of a metal material, an oxynitride of a metal material or other suitable materials or a stacked layer of the foregoing materials.

The second patterned conductive layer 600 includes a first data line 612, a first source 622, a first drain 632, a second data line 614, a second source 624, a second drain 234, and a touch wire 640. In the present embodiment, the second patterned conductive layer 600 further includes a third source 626, a third drain 636, a fourth source 628, and a fourth drain 638. In the present embodiment, since the touch wire 640, the first data line 612, and the second data line 614 all belong to the second patterned conductive layer 600, the number of masks required for manufacturing the pixel array substrate 10 can be reduced.

The first source 622 and the first drain 632 are electrically connected to the first pattern 510. The first source 622 is electrically connected to the first data line 612. The first gate 222, the first pattern 510, the first source 622, and the first drain 632 form a first switch component T1.

The second source 624 and the second drain 634 are electrically connected to the second pattern 520. The second source 624 is electrically connected to the first data line 612. The second gate 222, the second pattern 520, the second source 624, and the second drain 634 form a second switch component T2.

The third source 626 and the third drain 636 are electrically connected to the third pattern 530. The third source 626 is electrically connected to the second data line 614. The third gate 216, the third pattern 530, the third source 626, and the third drain 636 form a third switch component T3.

The fourth source 628 and the fourth drain 638 are electrically connected to the fourth pattern 540. The fourth source 628 is electrically connected to the second data line 614. The fourth gate 218, the fourth pattern 540, the fourth source 628, and the fourth drain 638 form a fourth switch component T4.

Although in the present embodiment, the first switch component T1, the second switch component T2, the third switch component T3, and the fourth switch component T4 are exemplified by a bottom gate type thin film transistor, but the present invention is not limited thereto. According to other embodiments, the first switch component T1, the second switch component T2, the third switch component T3, and the fourth switch component T4 may also be exemplified by a top gate type thin film transistor. In other words, in other embodiments, the semiconductor pattern layer 500 is located between the first patterned conductive layer 200 and the substrate 100.

The touch wire 640 is structurally separated from the first data line 612, the first source 622, the first drain 632, the second data line 614, the second source 624, the second drain 634, the third source 626, the third drain 636, the fourth source 628, and the fourth drain 638.

In the present embodiment, the touch wire 640 overlaps the first gap GP1 in the direction D perpendicular to the substrate 100. In the present embodiment, the touch wire 640 overlaps the second gap GP2 in the direction D perpendicular to the substrate 100. The touch wire 640 is located between the first data line 612 and the second data line 614 and adjacent to inner sides IS of the first pixel electrode 310 and the second pixel electrode 320. The second data line 614 is located on an outer side OS of the first pixel electrode 310. The first data line 612 is located on an outer side OS of the second pixel electrode 320. In the present embodiment, the touch wire 640 does not overlap the first pixel electrode 310, the second pixel electrode 320, the third pixel electrode 330, and the fourth pixel electrode 340 in the direction D perpendicular to the substrate 100. In the present embodiment, since the first dielectric layer 400 is provided between the pixel electrode layer 300 and the touch wire 640, the pixel electrode layer 300 is not easily short-circuited with the touch wire 640, so that the pixel electrode layer 300 has a large process margin.

In the present embodiment, the first transferring electrode 232 extends toward the touch wire 640 from the first drain 632, and the first transferring electrode 232 extends beyond a second side S2 of the touch wire 640 from a first side S1 of the touch wire 640. The second transferring electrode 234 extends toward the touch wire 640 from the second drain 634, and the second transferring electrode 634 does not extend beyond the touch wire 640. The third transferring electrode 236 extends toward the touch wire 640 from the third drain 636, and the third transferring electrode 236 does not extend beyond the touch wire 640. The fourth transferring electrode 238 extends toward the touch wire 640 from the fourth drain 638, and the fourth transferring electrode 238 extends beyond the first side S1 of the touch wire from the second side S2 of the touch wire 640. Based on the above, the pixel array substrate 10 may be applied to a 2-dot inversion driving method, and the problem of shaking lines of a liquid crystal display device is improved accordingly.

The second dielectric layer 700 is disposed on the substrate 100, and covers a part of the first dielectric layer 400, the first switch component T1, the second switch component T2, the first pixel electrode 310, the second pixel electrode 320, the third switch component T3, the fourth switch component T4, the third pixel electrode 330, and the fourth pixel electrode 340.

A first opening H1 is located in the second dielectric layer 700, and the first opening H1 overlaps the touch wire 640. A first through hole O1, a second through hole O2, a third through hole O3, and a fourth through hole O4 are located in the first dielectric layer 400 and the second dielectric layer 700. The first through hole O1 overlaps the first drain 632 and the first transferring electrode 232. The second through hole O2 overlaps the second drain 634 and the second transferring electrode 234. The third through hole O3 overlaps the third drain 636 and the third transferring electrode 236. The fourth through hole O4 overlaps the fourth drain 638 and the fourth transferring electrode 238.

The common electrode layer 800 is disposed on the substrate 100, and includes a common electrode 810, a first transferring electrode 822, a second transferring electrode 824, a third transferring electrode 826, and a fourth transferring electrode 828. In the present embodiment, the material of the common electrode layer 800 includes a transparent metal oxide conductive material or other suitable materials, such as, but not limited to, an indium tin oxide, an indium zinc oxide, an aluminum tin oxide, an aluminum zinc oxide, an indium gallium zinc oxide or other suitable materials or a stacked layer of the foregoing materials.

The common electrode 810 has a plurality of slits st. The shape, size and number of slits st may be adjusted according to actual needs. The common electrode 810 is electrically connected to the touch wire 640 via the first opening H1 to serve as a touch electrode. Although a vertical projection of the first opening H1 on the substrate 100 is located between vertical projections of the second scan line 214 and the third scan line 216 on the substrate 100 in the present embodiment, the present invention is not limited thereto. In other embodiments, the first opening H1 is located at other positions.

The first transferring electrode 822, the second transferring electrode 824, the third transferring electrode 826, and the fourth transferring electrode 828 are all structurally separated from the common electrode 810.

The first transferring electrode 822 is electrically connected to the first connection electrode 232 and the first drain 632 via the first through hole O1. The second transferring electrode 824 is electrically connected to the second connection electrode 234 and the second drain 634 via the second through hole O2. The third transferring electrode 826 is electrically connected to the third connection electrode 236 and the third drain 636 via the third through hole O3. The fourth transferring electrode 828 is electrically connected to the fourth connection electrode 238 and the fourth drain 638 via the fourth through hole O4.

In the present embodiment, the pixel array substrate 10 is applied to a liquid crystal display panel having a touch function. By the provision of the first transferring electrode 822, the first connection electrode 232, the second transferring electrode 824, and the second connection electrode 234, the number of masks required for manufacturing the pixel array substrate 10 can be reduced, so that the pixel array substrate 10 has the advantage of low manufacturing cost.

Figure 3:
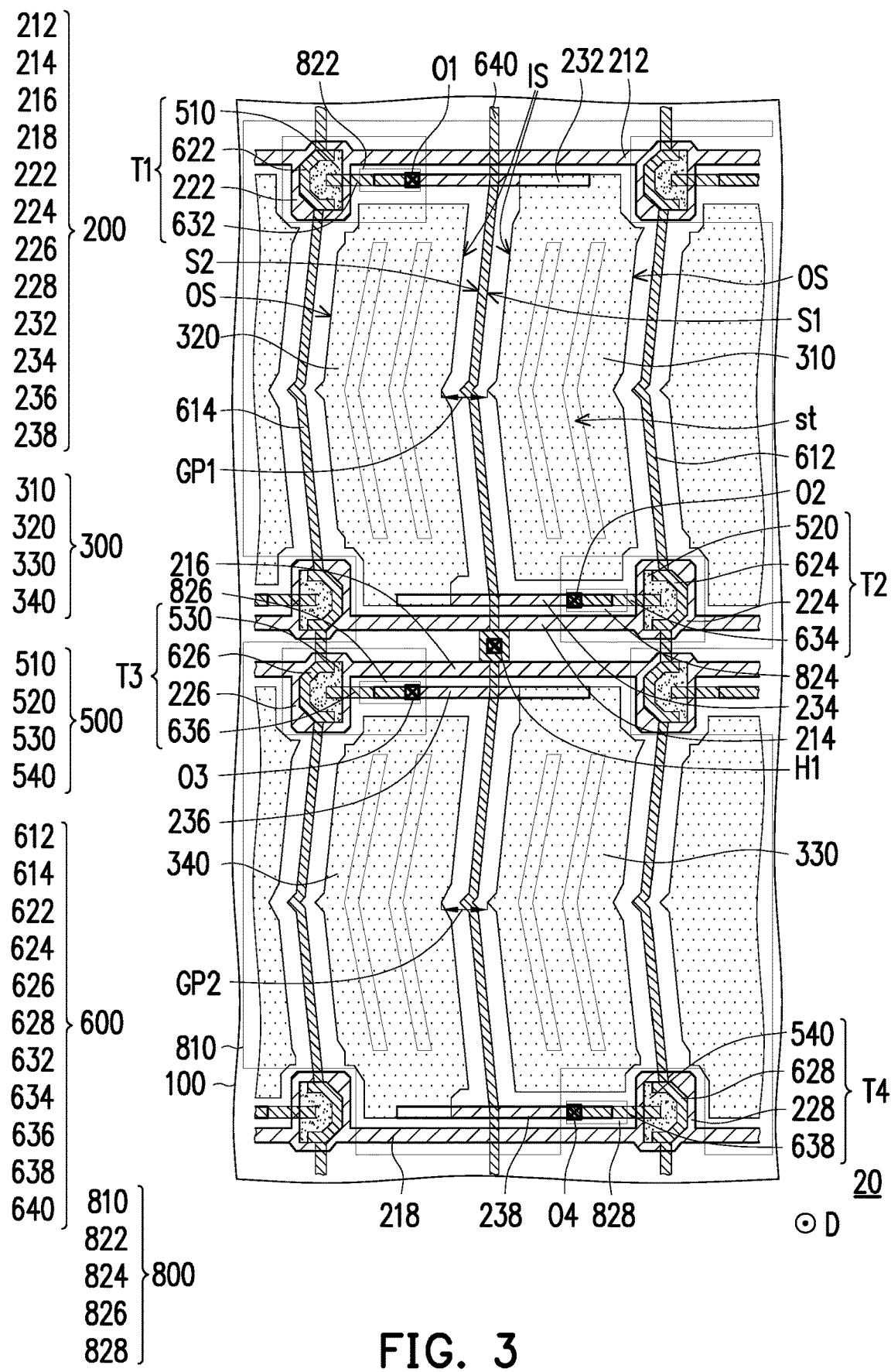
FIG. 3 is a schematic top view of a pixel array substrate in accordance with an embodiment of the present invention.

FIG. 3 is a schematic top view of a pixel array substrate in accordance with an embodiment of the present invention. For convenience of explanation, FIG. 3 omits some of the components in the pixel array substrate.

The main difference between a pixel array substrate 20 of FIG. 3 and the pixel array substrate 10 of FIG. 1 is that the first switch component T1 and the third switch component T3 of the pixel array substrate 20 are electrically connected to the first data line 612, and the second switch component T2 and the fourth switch component T3 are electrically connected to the second data line 614.

Referring to FIG. 3, the first source 622 and the third source 626 are electrically connected to the second data line 614, and the second source 624 and the fourth source 628 are electrically connected to the first data line 612.

The touch wire 640 is located between the first data line 612 and the second data line 614 and adjacent to the inner sides IS of the first pixel electrode 310 and the second pixel electrode 320. The first data line 612 is located on the outer side OS of the first pixel electrode 310. The second data line 614 is located on the outer side OS of the second pixel electrode 320.

The first transferring electrode 232 extends toward the touch wire 640 from the first drain 632, and the first transferring electrode 232 extends beyond the first side S1 of the touch wire 640 from the second side S2 of the touch wire 640. The second transferring electrode 234 extends toward the touch wire 640 from the second drain 634, and the second transferring electrode 234 extends beyond the second side S2 of the touch wire 640 from the first side S1 of the touch wire 640.

The third transferring electrode 236 extends toward the touch wire 640 from the third drain 636, and the third transferring electrode 236 extends beyond the first side S1 of the touch wire 640 from the second side S2 of the touch wire 640. The fourth transferring electrode 238 extends toward the touch wire 640 from the fourth drain 638, and the fourth transferring electrode 238 extends beyond the second side S2 of the touch wire 640 from the first side S1 of the touch wire 640.

In the present embodiment, the pixel array substrate 20 is applied to a liquid crystal display panel having a touch function. By the provision of the first transferring electrode 822, the first connection electrode 232, the second transferring electrode 824, and the second connection electrode 234, the number of masks required for manufacturing the pixel array substrate 20 can be reduced, so that the pixel array substrate 20 has the advantage of low manufacturing cost.

Figure 4:
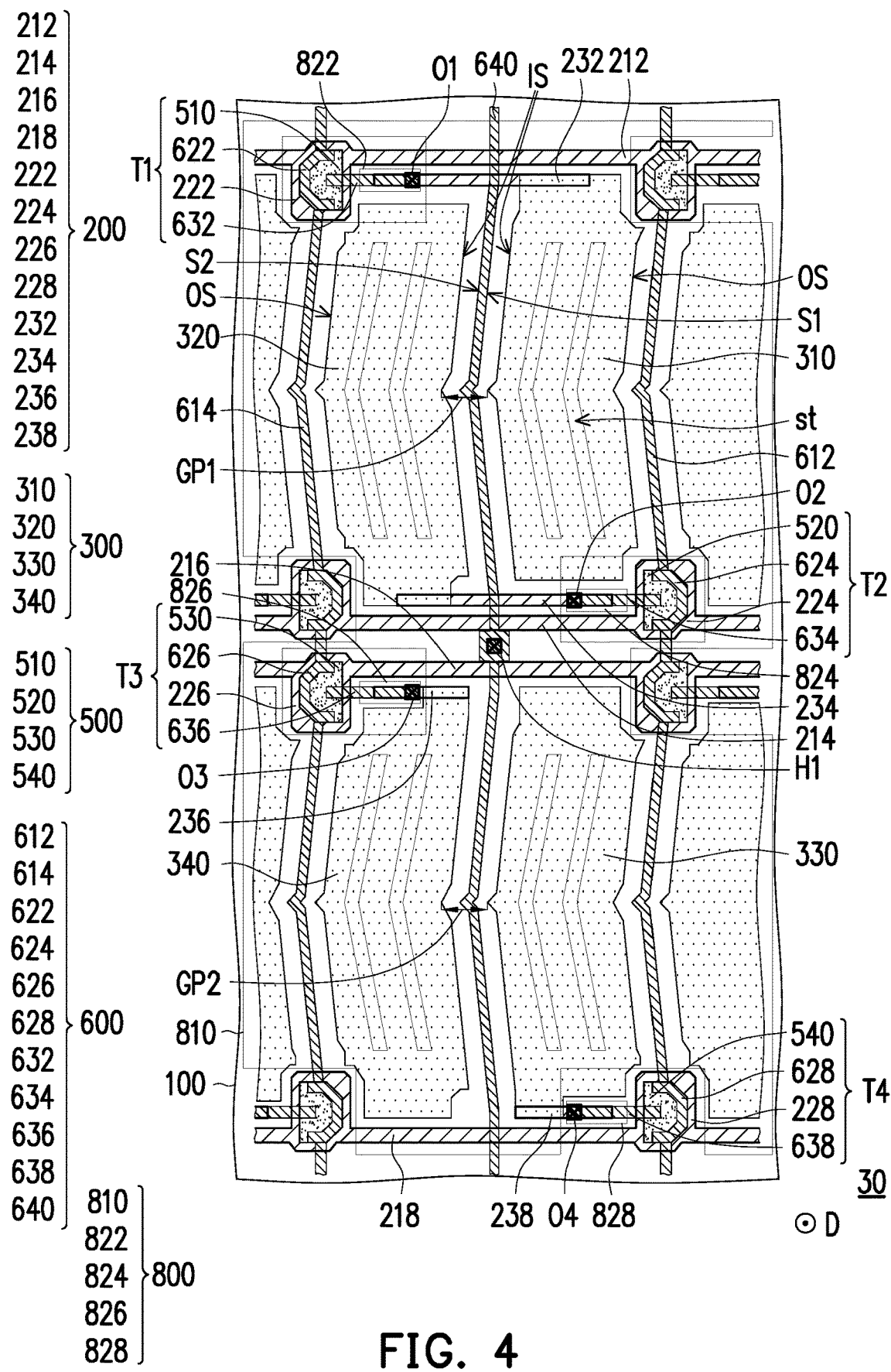
FIG. 4 is a schematic top view of a pixel array substrate in accordance with an embodiment of the present invention.

FIG. 4 is a schematic top view of a pixel array substrate in accordance with an embodiment of the present invention. For convenience of explanation, FIG. 4 omits some of the components in the pixel array substrate.

The main difference between a pixel array substrate 30 of FIG. 4 and the pixel array substrate 20 of FIG. 3 is that the third transferring electrode 236 and the fourth transferring electrode 238 of the pixel array substrate 30 do not extend beyond the touch wire 640.

The third transferring electrode 236 extends toward the touch wire 640 from the third drain 636, and the third transferring electrode 236 does not extend beyond the touch wire 640. The fourth transferring electrode 238 extends toward the touch wire 640 from the fourth drain 638, and the fourth transferring electrode 238 does not extend beyond the touch wire 640.

Based on the above, the pixel array substrate 30 may be applied to a dot inversion driving method, and the problem of shaking lines of a liquid crystal display device is improved accordingly.

In the present embodiment, the pixel array substrate 30 is applied to a liquid crystal display panel having a touch function. By the provision of the first transferring electrode 822, the first connection electrode 232, the second transferring electrode 824, and the second connection electrode 234, the number of masks required for manufacturing the pixel array substrate 30 can be reduced, so that the pixel array substrate 30 has the advantage of low manufacturing cost.

Based on the foregoing, by the provision of the first transferring electrode, the first connection electrode, the second transferring electrode, and the second connection electrode, the present invention can reduce the number of masks required for manufacturing the pixel array substrate, so that the pixel array substrate has the advantage of low manufacturing cost. In some embodiments, the pixel array substrate may be applied to a dot inversion driving method or a 2-dot inversion driving method, so that the problem of shaking lines of a liquid crystal display device is improved.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A pixel array substrate, comprising:
   a substrate;
   a first patterned conductive layer, disposed on the substrate and comprising:
      a first scan line, a second scan line, a first gate connected to the first scan line, a second gate connected to the second scan line, a first connection electrode, and a second connection electrode, both the first connection electrode and the second connection electrode being structurally separated from the first gate, the second gate, the first scan line, and the second scan line;
   a pixel electrode layer, disposed on the substrate and comprising:
      a first pixel electrode, partially overlapping the first connection electrode; and
      a second pixel electrode, partially overlapping the second connection electrode, wherein a first gap is provided between the first pixel electrode and the second pixel electrode;
   a semiconductor pattern layer, disposed on the substrate and comprising:
      a first pattern, partially overlapping the first gate; and
      a second pattern, partially overlapping the second gate;
   a first dielectric layer, disposed on the substrate and disposed between the first pattern and the first gate and between the second pattern and the second gate;
   a second patterned conductive layer, disposed on the substrate, wherein the second patterned conductive layer comprises:
      a first data line and a second data line;
      a first source and a first drain, wherein the first source and the first drain are electrically connected to the first pattern, the first source is electrically connected to the first data line, and the first gate, the first pattern, the first source, and the first drain form a first switch component;

a second source and a second drain, wherein the second source and the second drain are electrically connected to the second pattern, the second source is electrically connected to the first data line, and the second gate, the second pattern, the second source, and the second drain form a second switch component; and a touch wire, structurally separated from the first data line, the first source, the first drain, the second data line, the second source, and the second drain;

a second dielectric layer, disposed on the substrate and covering a part of the first dielectric layer, the first switch component, the second switch component, the first pixel electrode, and the second pixel electrode, wherein a first opening is located in the second dielectric layer, and a first through hole and a second through hole are located in the first dielectric layer and the second dielectric layer; and a common electrode layer, disposed on the substrate and comprising:
a common electrode, having a plurality of slits, the common electrode being electrically connected to the touch wire via the first opening to serve as a touch electrode; and
a first transferring electrode and a second transferring electrode, both structurally separated from the common electrode, the first transferring electrode being electrically connected to the first connection electrode and in contact with the first drain via the first through hole, and the second transferring electrode being electrically connected to the second connection electrode and in contact with the second drain via the second through hole.

2. The pixel array substrate according to claim 1, wherein the touch wire overlaps the first gap in a direction perpendicular to the substrate.

3. The pixel array substrate according to claim 1, wherein the touch wire does not overlap the first pixel electrode and the second pixel electrode in a direction perpendicular to the substrate.

4. The pixel array substrate according to claim 2, wherein the touch wire is located between the first data line and the second data line and is adjacent to an inner side of the first pixel electrode and an inner side of the second pixel electrode, the second data line is located on an outer side of the first pixel electrode, and the first data line is located on an outer side of the second pixel electrode.

5. The pixel array substrate according to claim 1, wherein the first transferring electrode extends toward the touch wire from the first drain, and the first transferring electrode extends beyond a second side of the touch wire from a first side of the touch wire, wherein the second transferring electrode extends toward the touch wire from the second drain, and the second transferring electrode does not extend beyond the touch wire.

6. The pixel array substrate according to claim 1, wherein the first patterned conductive layer further comprises:
a third scan line, a fourth scan line, a third gate connected to the third scan line, a fourth gate connected to the fourth scan line, a third connection electrode, and a fourth connection electrode, the first connection electrode, the second connection electrode, the third connection electrode, and the fourth connection electrode being all structurally separated from the first gate, the second gate, the third gate, the fourth gate, the first scan line, the second scan line, the third scan line, and the fourth scan line;

the pixel electrode layer further comprises:
a third pixel electrode, partially overlapping the third connection electrode; and
a fourth pixel electrode, partially overlapping the fourth connection electrode, wherein a second gap is provided between the third pixel electrode and the fourth pixel electrode;

the semiconductor pattern layer further comprises:
a third pattern, partially overlapping the third gate; and
a fourth pattern, partially overlapping the fourth gate, the first dielectric layer being disposed between the third pattern and the third gate and between the fourth pattern and the fourth gate;

the second patterned conductive layer further comprises:
a third source and a third drain, wherein the third source and the third drain are electrically connected to the third pattern, the third source is electrically connected to the second data line, and the third gate, the third pattern, the third source, and the third drain form a third switch component; and
a fourth source and a fourth drain, wherein the fourth source and the fourth drain are electrically connected to the fourth pattern, the fourth source is electrically connected to the second data line, and the fourth gate, the fourth pattern, the fourth source, and the fourth drain form a fourth switch component;

the second dielectric layer covers the third switch component, the fourth switch component, the third pixel electrode, and the fourth pixel electrode, wherein a third through hole and a fourth through hole are located in the first dielectric layer and the second dielectric layer; and the common electrode layer further comprises:
a third transferring electrode and a fourth transferring electrode, both structurally separated from the common electrode, the third transferring electrode being electrically connected to the third connection electrode and the third drain via the third through hole, and the fourth transferring electrode being electrically connected to the fourth connection electrode and the fourth drain via the fourth through hole.

7. The pixel array substrate according to claim 6, wherein the third transferring electrode extends toward the touch wire from the third drain, and the third transferring electrode does not extend beyond the touch wire, wherein the fourth transferring electrode extends toward the touch wire from the fourth drain, and the fourth transferring electrode extends beyond the first side of the touch wire from the second side of the touch wire.

8. The pixel array substrate according to claim 1, wherein the first transferring electrode does not overlap the second pixel electrode in a direction perpendicular to the substrate, and the second transferring electrode does not overlap the first pixel electrode in a direction perpendicular to the substrate.

9. A pixel array substrate, comprising:
a substrate;
a first patterned conductive layer, disposed on the substrate and comprising:
a first scan line, a second scan line, a first gate connected to the first scan line, a second gate connected to the second scan line, a first connection electrode, and a second connection electrode, both the first connection electrode and the second connection electrode being structurally separated from the first gate, the second gate, the first scan line, and the second scan line;

a pixel electrode layer, disposed on the substrate and comprising:
  a first pixel electrode, partially overlapping the first connection electrode; and
  a second pixel electrode, partially overlapping the second connection electrode, wherein a first gap is provided between the first pixel electrode and the second pixel electrode;
a semiconductor pattern layer, disposed on the substrate and comprising:
  a first pattern, partially overlapping the first gate; and
  a second pattern, partially overlapping the second gate;
a first dielectric layer, disposed on the substrate and disposed between the first pattern and the first gate and between the second pattern and the second gate;
a second patterned conductive layer, disposed on the substrate and comprising:
  a first data line and a second data line;
  a first source and a first drain, wherein the first source and the first drain are electrically connected to the first pattern, the first source is electrically connected to the second data line, and the first gate, the first pattern, the first source, and the first drain form a first switch component;
  a second source and a second drain, wherein the second source and the second drain are electrically connected to the second pattern, the second source is electrically connected to the first data line, and the second gate, the second pattern, the second source, and the second drain form a second switch component; and
  a touch wire, structurally separated from the first data line, the first source, the first drain, the second data line, the second source, and the second drain;
a second dielectric layer, disposed on the substrate and covering a part of the first dielectric layer, the first switch component, the second switch component, the first pixel electrode, and the second pixel electrode, wherein a first opening is located in the second dielectric layer, and a first through hole and a second through hole are located in the first dielectric layer and the second dielectric layer; and
a common electrode layer, disposed on the substrate and comprising:
  a common electrode, having a plurality of slits, the common electrode being electrically connected to the touch wire via the first opening to serve as a touch electrode; and
  a first transferring electrode and a second transferring electrode, both structurally separated from the common electrode, the first transferring electrode being electrically connected to the first connection electrode and in contact with the first drain via the first through hole, and the second transferring electrode being electrically connected to the second connection electrode and in contact with the second drain via the second through hole.

10. The pixel array substrate according to claim 9, wherein the touch wire overlaps the first gap in a direction perpendicular to the substrate.

11. The pixel array substrate according to claim 9, wherein the touch wire does not overlap the first pixel electrode and the second pixel electrode in a direction perpendicular to the substrate.

12. The pixel array substrate according to claim 10, wherein the touch wire is located between the first data line and the second data line and is adjacent to an inner side of the first pixel electrode and an inner side of the second pixel electrode, the first data line is located on an outer side of the first pixel electrode, and the second data line is located on an outer side of the second pixel electrode.

13. The pixel array substrate according to claim 9, wherein the first transferring electrode extends toward the touch wire from the first drain, and the first transferring electrode extends beyond a first side of the touch wire from a second side of the touch wire, wherein the second transferring electrode extends toward the touch wire from the second drain, and the second transferring electrode extends beyond the second side of the touch wire from the first side of the touch wire.

14. The pixel array substrate according to claim 9, wherein
  the first patterned conductive layer further comprises:
    a third scan line, a fourth scan line, a third gate connected to the third scan line, a fourth gate connected to the fourth scan line, a third connection electrode, and a fourth connection electrode, the first connection electrode, the second connection electrode, the third connection electrode, and the fourth connection electrode being all structurally separated from the first gate, the second gate, the third gate, the fourth gate, the first scan line, the second scan line, the third scan line, and the fourth scan line;
  the pixel electrode layer further comprises:
    a third pixel electrode, partially overlapping the third connection electrode; and
    a fourth pixel electrode, partially overlapping the fourth connection electrode, wherein a second gap is provided between the third pixel electrode and the fourth pixel electrode;
  the semiconductor pattern layer further comprises:
    a third pattern, partially overlapping the third gate; and
    a fourth pattern, partially overlapping the fourth gate, the first dielectric layer being disposed between the third pattern and the third gate and between the fourth pattern and the fourth gate;
  the second patterned conductive layer further comprises:
    a third source and a third drain, wherein the third source and the third drain are electrically connected to the third pattern, the third source is electrically connected to the second data line, and the third gate, the third pattern, the third source, and the third drain foi in a third switch component; and
    a fourth source and a fourth drain, wherein the fourth source and the fourth drain are electrically connected to the fourth pattern, the fourth source is electrically connected to the first data line, and the fourth gate, the fourth pattern, the fourth source, and the fourth drain form a fourth switch component;
  the second dielectric layer covers the third switch component, the fourth switch component, the third pixel electrode, and the fourth pixel electrode, wherein a third through hole and a fourth through hole are located in the first dielectric layer and the second dielectric layer; and
  the common electrode layer further comprises:
    a third transferring electrode and a fourth transferring electrode, both structurally separated from the common electrode, the third transferring electrode being electrically connected to the third connection electrode and the third drain via the third through hole, and the fourth transferring electrode being electrically connected to the fourth connection electrode and the fourth drain via the fourth through hole.

15. The pixel array substrate according to claim 14, wherein the third transferring electrode extends toward the touch wire from the third drain, and the third transferring electrode does not extend beyond the touch wire, wherein the fourth transferring electrode extends toward the touch wire from the fourth drain, and the fourth transferring electrode does not extend beyond the touch wire.

16. The pixel array substrate according to claim 9, wherein the first transferring electrode does not overlap the second pixel electrode in a direction perpendicular to the substrate, and the second transferring electrode does not overlap the first pixel electrode in a direction perpendicular to the substrate.

17. The pixel array substrate according to claim 1, wherein the first scan line, the second scan line, the first gate, the second gate, the first connection electrode, and the second connection electrode are located between the first dielectric layer and the substrate.

18. The pixel array substrate according to claim 9, wherein the first scan line, the second scan line, the first gate, the second gate, the first connection electrode, and the second connection electrode are located between the first dielectric layer and the substrate.

\* \* \* \* \*